(12) United States Patent
Huang et al.

(10) Patent No.: US 11,119,119 B2
(45) Date of Patent: Sep. 14, 2021

(54) ELECTRICAL TEST PROBE AND TESTING SYSTEM USING THE SAME

(71) Applicant: Telefonaktiebolaget LM Ericsson (publ), Stockholm (SE)

(72) Inventors: Jun Huang, Shanghai (CN); Minghai He, Shanghai (CN); Xuegang Jiang, Shanghai (CN); Canglong Tang, Shanghai (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 193 days.

(21) Appl. No.: 16/463,976

(22) PCT Filed: Dec. 9, 2016

(86) PCT No.: PCT/CN2016/109232
§ 371 (c)(1),
(2) Date: May 24, 2019

(87) PCT Pub. No.: WO2018/103074
PCT Pub. Date: Jun. 14, 2018

(65) Prior Publication Data
US 2020/0300891 A1    Sep. 24, 2020

(51) Int. Cl.
*G01R 1/067* (2006.01)
*G01R 31/40* (2020.01)

(52) U.S. Cl.
CPC ..... *G01R 1/06722* (2013.01); *G01R 1/06777* (2013.01); *G01R 31/40* (2013.01)

(58) Field of Classification Search
CPC .. G01R 1/06722; G01R 1/06738; G01R 3/00; G01R 1/07314; G01R 1/0466;
(Continued)

(56) References Cited

U.S. PATENT DOCUMENTS 4,200,351 A  *  4/1980  Long ................. G01R 1/06722
                                                         439/824
5,403,678 A  *  4/1995  Fields ................ H01M 50/571
                                                         429/65
(Continued)

FOREIGN PATENT DOCUMENTS

CN        201819929 U       5/2011
CN        102435798 A       5/2012
(Continued)

OTHER PUBLICATIONS

H. Stahr, M. Morianz, S. Gross, M. Unger, J. Nicolics and L. Boettcher, "Investigation of a power module with double sided cooling using a new concept for chip embedding," CIPS 2016; 9th International Conference on Integrated Power Electronics Systems, Nuremberg, Germany, 2016 (Year: 2016).*

(Continued)

*Primary Examiner* — Daniel R Miller
(74) *Attorney, Agent, or Firm* — Sage Patent Group

(57) ABSTRACT

An electrical test probe (200) is presented. It comprises a test prod (210), a tube (220) and an elastic element (230). The test prod (210) has a first terminal (211) provided to form a contact with a power module to be tested and a second terminal (212) provided to be connected with a testing equipment. The test prod (210) also has a first stopper (213) between the first terminal (211) and the second terminal (212). The tube (220) has an internally extending stopper (221). The tube (220) is mounted around the test prod (210) in a longitudinal direction of the test prod (210). The elastic element (230) is accommodated between the first stopper (213) of the test prod (210) and the internally extending stopper (221) of the tube (220). The tube (220) and the test prod (210) can have a relative movement within an elastic range of the elastic element (230). The area of a cross section of the test prod (210) is much larger than the area of the cross (Continued)

section of the elastic element (230). A power module testing system (600) which comprises at least one electrical test probe (200) is also presented.

17 Claims, 6 Drawing Sheets

(58) Field of Classification Search
CPC ............ G01R 1/06733; G01R 1/06761; G01R 1/0483; G01R 31/2801; G01R 1/06716; G01R 31/2886; G01R 1/06705; G01R 1/06772; G01R 1/07307; G01R 1/07328; G01R 1/07357
See application file for complete search history.

(56) References Cited

U.S. PATENT DOCUMENTS

| | | | | |
|---|---|---|---|---|
| 2001/0001537 A1* | 5/2001 | McNulty | ............ | G01R 1/06777 |
| | | | | 324/72.5 |
| 2005/0110505 A1* | 5/2005 | Stanley Tsui | ...... | G01R 1/06733 |
| | | | | 324/755.05 |
| 2005/0184747 A1 | 8/2005 | Sanders | | |
| 2007/0269999 A1* | 11/2007 | Di Stefano | ........ | H01R 13/2471 |
| | | | | 439/73 |
| 2009/0146644 A1* | 6/2009 | Tan | .................... | G01R 1/06788 |
| | | | | 324/149 |
| 2011/0275229 A1* | 11/2011 | Lin | ...................... | H01R 12/714 |
| | | | | 439/68 |
| 2012/0286816 A1* | 11/2012 | Kister | ................ | G01R 1/06738 |
| | | | | 324/755.01 |
| 2013/0203298 A1* | 8/2013 | Zhou | .................. | H01R 13/2435 |
| | | | | 439/700 |
| 2013/0321015 A1 | 12/2013 | Okada et al. | | |
| 2015/0253356 A1* | 9/2015 | Kuo | ................... | G01R 1/06722 |
| | | | | 324/755.05 |
| 2016/0124016 A1* | 5/2016 | Shi | .......................... | G01R 3/00 |
| | | | | 324/755.02 |

FOREIGN PATENT DOCUMENTS

| | | |
|---|---|---|
| CN | 203037688 U | 7/2013 |
| CN | 103454460 A | 12/2013 |
| CN | 203365492 U | 12/2013 |
| CN | 105044406 A | 11/2015 |
| DE | 202011000839 U1 | 3/2014 |
| KR | 20040052916 A | 6/2004 |

OTHER PUBLICATIONS

Supplementary European Search Report issued in corresponding EP Application No. 16923597.5 dated Dec. 18, 2019, 08 Pages.

* cited by examiner (a)

(b)

ELECTRICAL TEST PROBE AND TESTING SYSTEM USING THE SAME

TECHNICAL FIELD

The non-limiting and example embodiments of the present disclosure generally relate to the testing field, and specifically to an electrical test probe for testing a power module, particularly a high power and high current power module, and a power module testing system using the electrical test probe.

BACKGROUND

This section introduces aspects that may facilitate better understanding of the present disclosure. Accordingly, the statements of this section are to be read in this light and are not to be understood as admissions about what is in the prior art or what is not in the prior art.

A power module or power electronic module provides the physical containment for several power components, usually power semiconductor devices. These power semiconductors are typically soldered or sintered on a power electronic substrate that carries the power semiconductors, provides electrical and thermal contact and electrical insulation where needed. The power modules are widely used in communication infrastructures, e.g. in base stations. With the further development of communication technologies, e.g. with higher transmission rates, higher throughputs, stricter requirements on signal quality, wider deployment etc., especially with the incoming of $5^{th}$ Generation (5 G)/New Radio (NR) era, the power modules require even higher power and higher current distribution. Furthermore, with the development of power modules, the power of a power module can be increased with a geometric growth from 100 W, to 400 W, 800 W or 1000 W and maybe even higher in the future. Also, miniaturization, high integration and high power density are a trend for power module design/manufacture, which requires efficient thermal dissipation. Therefore, the high power/current and thermal dissipation requirements form a challenge for testing and manufacturing of power modules.

FIG. 1 shows a schematic structure of an existing standard test probe 100 generally used in testing of a power module. As shown, the test probe 100 has a contact terminal 110, which will be used to contact an input/output terminal of the power module to be tested. On the opposite end, the test probe 100 has a terminal 120 to be connected with a cable of a testing equipment. In order to form a close contact between the test probe and the power module to be tested, while avoiding damage to the test probe due to a hard contact with the input/output terminal of the power module, there is usually a spring provided between the contact terminal 110 and the opposite terminal 120. Therefore, when the test probe 100 is in use for testing the power module, there must be a current passing through the spring.

SUMMARY

Various embodiments of the present disclosure mainly aim at providing an electrical test probe with a longer life cycle and a testing system using the test probe. Other features and advantages of embodiments of the present disclosure will also be understood from the following description of specific embodiments when read in conjunction with the accompanying drawings, which illustrate, by way of example, the principles of embodiments of the present disclosure.

In a first aspect of the present disclosure, there is provided an electrical test probe. The electrical test probe comprises a test prod, a tube and an elastic element. The test prod has a first terminal provided to form a contact with a power module to be tested and a second terminal provided to be connected with a testing equipment. The test prod also has a first stopper between the first terminal and the second terminal. The tube has an internally extending stopper. The tube is mounted around the test prod in a longitudinal direction of the test prod. The elastic element is accommodated between the first stopper of the test prod and the internally extending stopper of the tube. The tube and the test prod can have a relative movement within an elastic range of the elastic element. The area of a cross section of the test prod is larger than the area of the cross section of the elastic element. As an example, the elastic element may be a spring.

By arranging the elastic element around the test prod, i.e. the elastic elements and the test prod being arranged in parallel, due to smaller resistance exhibited by the elastic element than the test prod, most current can pass through the test prod directly. Thus the current passing through the elastic element is relatively low and then less heat is generated along the elastic element. Therefore, the life of the elastic element may be increased and accordingly life-cycles of the whole test probe can be increased.

In an embodiment, a first end of the elastic element is fixed to the first stopper of the test prod and a second end of the elastic element is fixed to the internally extending stopper of the tube.

In another embodiment, the internally extending stopper may be formed as an internally bending end, while the first stopper may be formed as a protrusion from the test prod.

In yet another embodiment, the test prod may have a heat sink on the side of the first terminal of the test prod. The first terminal of the test prod is provided to form a contact with the power module to be tested. Therefore, by using a heat sink on the first terminal of the test prod, i.e. at the interconnect surface between the test probe and the power module to be tested, heat dissipation performance is improved.

In yet another embodiment, the second terminal of the test prod may be electrically connected with the testing equipment via an adaptor.

In yet another embodiment, the first terminal of the test prod may have a conic shape.

In a second aspect of the present disclosure, there is provided a power module testing system. The power module testing system comprises an electrical test probe according to the first aspect of the present disclosure, a test platform and a testing equipment. The test platform is provided to hold the electrical test probe. The test platform may also assist connection of the test probe with the testing equipment. The testing equipment is provided to test a power module via the electrical test probe. As an example, the test platform may be made of an insulating material.

In an embodiment, an adaptor may be held over a first surface of the test platform. A cable of the testing equipment may be electrically connected to the adaptor. The second terminal of the test prod of the electrical test probe may be passed through the test platform from a second surface of the test platform towards the first surface and electrically connected to the adaptor. The second surface is opposite to the first surface.

In another embodiment, the cable of the testing equipment may be screwed and soldered on the adaptor. The test prod of the electrical test probe may be threaded into the adaptor.

In yet another embodiment, the tube of the test probe may be fixed on the test platform. The test platform can guide movement of the test probe towards or away from the power module to be tested.

BRIEF DESCRIPTION OF THE DRAWINGS

The above and other aspects, features, and benefits of various embodiments of the present disclosure will become more fully apparent, by way of example, from the following detailed description with reference to the accompanying drawings, in which like or same reference numerals or letters are used to designate equivalent or same elements. The drawings are illustrated for facilitating better understanding of the embodiments of the disclosure and not necessarily drawn to scale, in which.

DETAILED DESCRIPTION

Hereinafter, the principle and spirit of the present disclosure will be described with reference to illustrative embodiments. It should be understood, all these embodiments are given merely for one skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification.

References in the specification to "one embodiment", "an embodiment", "another embodiment" etc. indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

In the following description and claims, unless defined otherwise, all technical and scientific terms used herein have the same meaning as commonly understood by one of ordinary skills in the art to which this disclosure belongs.

Figure 1:
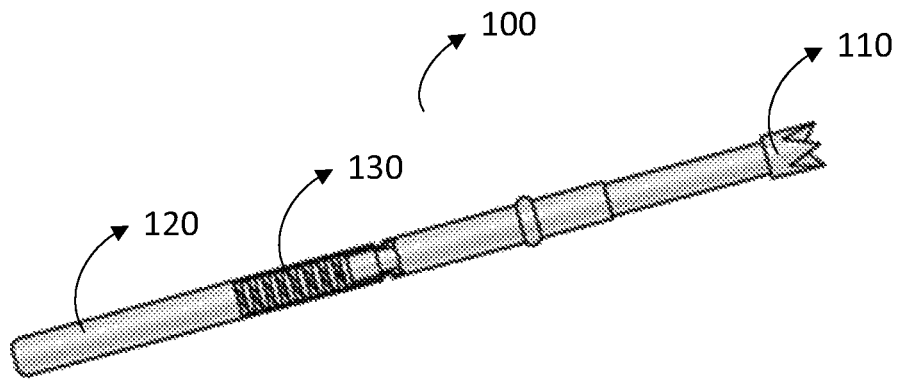
FIG. 1 shows a schematic structure of an existing standard test probe generally used in testing of a power module.

As discussed in the Background with reference to FIG. 1, the existing standard test probe always needs a spring to guarantee a soft and close contact with the input/output terminal of the power module to be tested. This kind of test probes work well with a lower current, e.g. 10 Å. However, due to the small cross-section area of the spring, the spring exhibits a high resistance. As the output current of the power module increases, the current passing through the spring is also increased, e.g. to 100 Å, which causes the spring to be easily broken or even melted due to large amount of heat generated when the high current passing through the spring. Accordingly, the shelf cycles of the test probe are reduced to a very limited number of times and cannot meet a generally desired number, e.g. 5000 times.

Also, the existing standard test probe cannot handle the power module with both a lower voltage (such as 1V) output and a higher current (such as 100 Å) output. Especially the testing equipment cannot load a power module with the standard test probe, for example due to the high resistance of the test probe relative to the power module and the high contact resistance between the test probe and the power module.

Besides, the existing standard test probes are not able to efficiently dissipate heat at the interconnect interface to the power module, which results in limited mating/un-mating cycles of the test probes, since the contact resistance increases proportionally with the generated heat and meanwhile the generated heat increases in proportion to the resistance. A smaller contact area, e.g. a point contact of the test probe with the power module, results in a higher contact resistance, which may even result in burning of the interconnect interface.

In order to solve at least part of the above problems, embodiments of the present disclosure propose an electrical test probe of a new structure and a power module testing system using the proposed electrical test probe.

Figure 2:
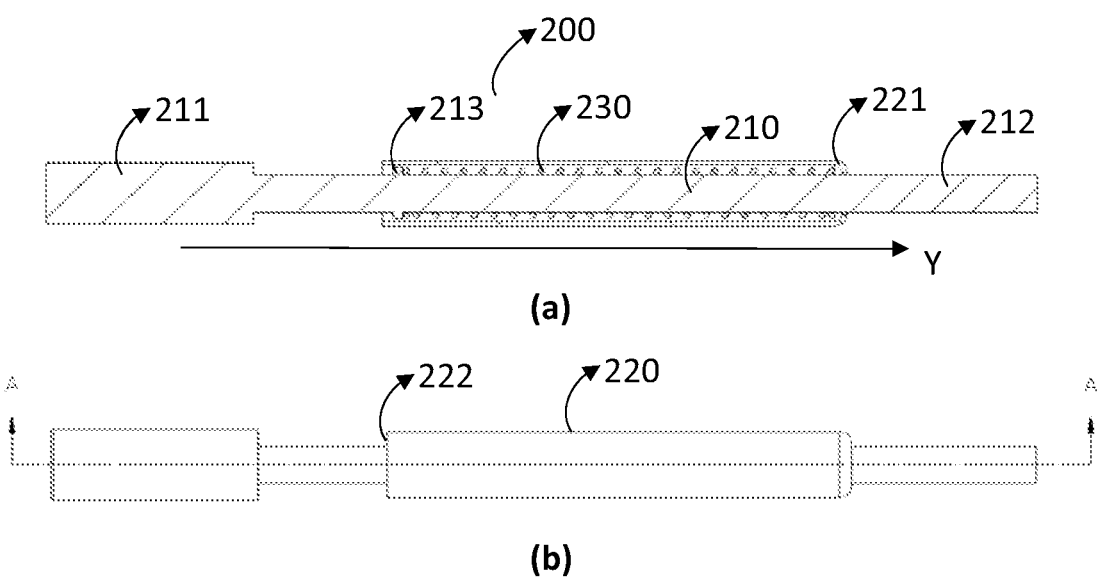
FIG. 2 illustrate a schematic structure of an electrical test probe according to an embodiment of the present disclosure.

FIG. 2 illustrates a schematic structure of an electrical test probe 200 according to an embodiment of the present disclosure. Particularly, FIG. 2(a) shows a cross-section view of the electrical test probe 200 along line A-A, while FIG. 2(b) shows a top view of the electrical test probe 200.

In the embodiment as shown, the electrical test probe 200 comprises a test prod 210, a tube 220 and an elastic element 230.

The test prod 210 has a first terminal 211, which is provided to form a contact with a power module to be tested and a second terminal 212, which is provided to be connected with a testing equipment. The testing equipment could draw/sink current from/into the power module via the terminals. The testing equipment can test the voltage/current output of the power module with or without a load, and may also generate various signals with different shapes, different voltages, and/or different currents to activate the power module so as to obtain different outputs at input/output terminals of the power module. Based on the outputs of the power module, various functions of the power module can be tested.

The test prod 210 also has a stopper 213 (which will be referred to as a first stopper hereafter) between the first terminal 211 and the second terminal 212.

The tube 220 has an internally extending stopper 221, which may be formed as an internally bending end in some embodiments.

The tube 220 is mounted around the test prod 210 in a longitudinal direction Y of the test prod 210. For ease of installation of the tube 220 onto the test prod 210, the tube 220 may have an opening end 222, so that the test prod 210 can be easily inserted into the tube 220 through the opening end 222.

As illustrated in FIG. 2(a), the elastic element 230 is accommodated between the test prod 210 and the tube 220, particularly between the first stopper 213 of the test prod 210 and the internally extending stopper 221 of the tube 220. Preferably, the elastic element 230 in a free state may fit, along the longitudinal direction Y, into a space between the test prod 210 and the tube 220.

In particular, one end of the elastic element 230 is fixed on the first stopper 213 of the test prod 210 and the other end of the elastic element 230 is fixed on the internally extending stopper 221 of the tube 220.

When there is a pressure on the tube in the longitudinal direction Y to the left, the tube 220 can have a movement relative to the test prod 210 within an elastic range of the elastic element 230. The elastic element 230 will be pressed by the internally extending stopper 221 of the tube 220 towards the first stopper 213. When there is a pressure on the test prod 210 in the longitudinal direction Y to the right, the test prod 210 can have a movement relative to the tube 220 within the elastic range of the elastic element 230. The elastic element 230 will be pressed by the first stopper 213 of the test prod 210 towards the externally extending stopper 221 of the tube 220.

The area of a cross section of the test prod 210 is larger than the area of the cross section of the elastic element 230. In this case, the test prod 210 may exhibit a smaller resistance than the elastic element 230. Thus, if the test probe 200 is connected between the power module to be tested and the testing equipment, due to the smaller resistance of the test prod 210 than the elastic element 230, more current will pass through the test prod 210 than the elastic element 230. By increasing the cross-section area ratio of the test prod 210 to the elastic element 230, for example if the ratio is larger than 10 times or even larger, most current will pass through the test prod 210, while very small (ignorable in some embodiments) amount of the current will pass through the elastic element 230.

With this structure as shown in FIG. 2, even though a high current may pass through the test probe 200 from the high power module to the testing equipment, only a very small amount of current will pass through the elastic element 230, so that less heat may be generated and the shelf cycles of the test probe 200 can be increased. A simple example of the elastic element 230 is a spring.

In an embodiment, the test prod 200 may be made of C14500 tellurium copper, e.g. with plating 1 μm Au (aurum) and 0.2~0.3 μm Ni (nickel) and 0.7 g Co (cobalt), for high wear capability and good durability. The high percentage of copper may make the test probe ideal for electrical conduction and thermal dissipation. The hardness of C14500 may provide good manufacturing performance.

Figure 3:
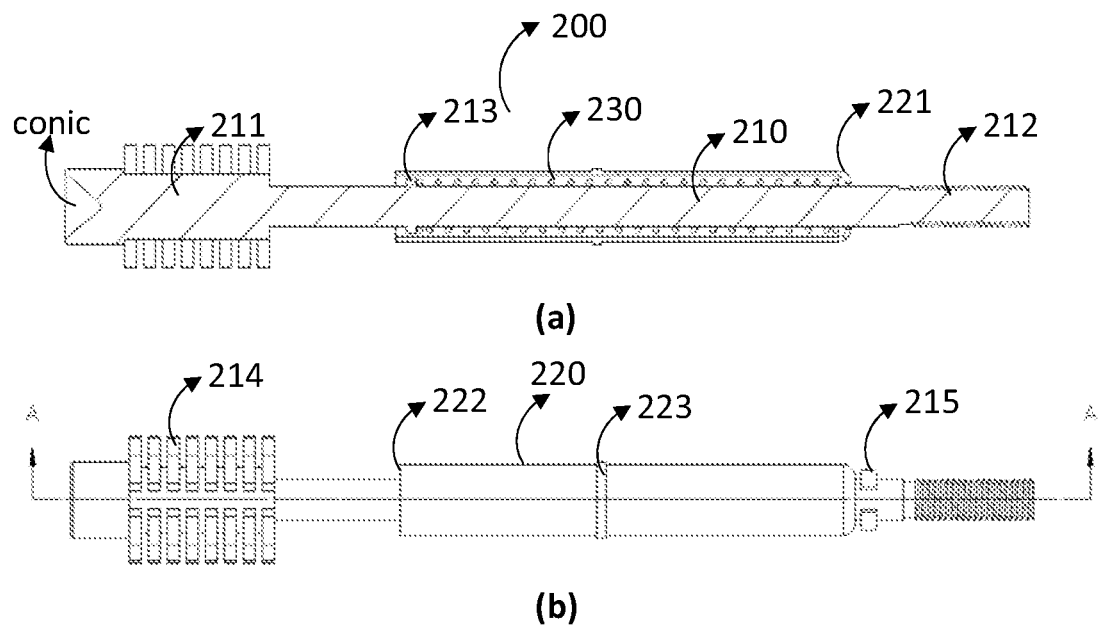
FIG. 3 illustrates a schematic structure of the electrical test probe of FIG. 2 according to further embodiments of the present disclosure.

FIG. 3 illustrates a schematic structure of the electrical test probe 200 according to further embodiments of the present disclosure. Particularly, FIG. 3(a) shows a cross-section view of the electrical test probe 200 along line A-A, while FIG. 3(b) shows a top view of the electrical test probe 200. It shall be appreciated that the same reference numerals are used in FIG. 3 to indicate the same elements or parts of the test probe 200 of FIG. 2. The reference numerals not used in FIG. 2 but used in FIG. 3 indicate additional elements or parts of the test probe 200 according to further embodiments of the present disclosure.

In an embodiment, the first stopper 213 of the test prod 210 may be formed as a protrusion from the test prod 210. The first stopper 213 may be formed in a ring shape around the test prod 210.

In another embodiment, the test prod 210 may have a heat sink 214 on the side of the first terminal 211 of the test prod 210, which is helpful for heat dissipation at the interconnect interface between the test probe 200 and the power module to be tested.

Figure 4:
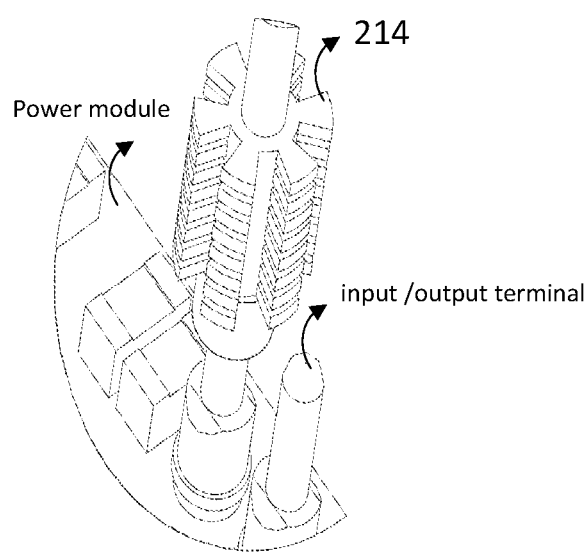
FIG. 4 illustrates an enlarged figure showing the fan structure of the heat sink according to an embodiment of the present disclosure.

The heat sink 214 may have a fan structure to facilitate thermal distribution at the interconnect interface. The heat sink 214 may be provided as close as possible to the end of the first terminal 211. FIG. 4 illustrates an enlarged figure showing the fan structure of the heat sink 214 according to an embodiment of the present disclosure.

In a further embodiment, the second terminal 212 of the test prod 210 may be electrically connected with the testing equipment via an adaptor (which will be detailed later). For example, the second terminal 212 may be threaded so as to be connected to the adaptor in a thread connection. The adaptor is further electrically connected with the testing equipment. It shall be appreciated that other well-known connecting methods are also possible to connect the second terminal 212 with the adaptor, which do not form a limitation to the present disclosure.

Figure 5:
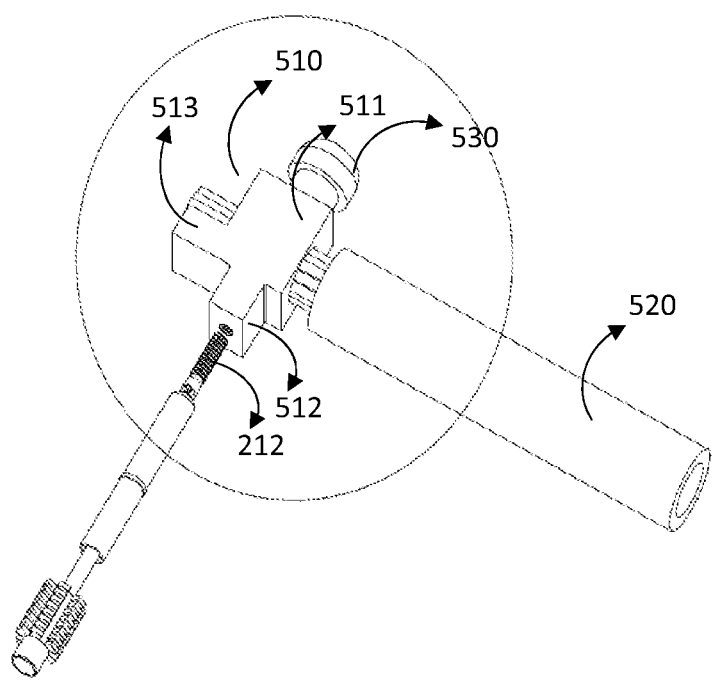
FIG. 5 illustrates an example of how the second terminal of a test prod is connected to an adaptor according to an embodiment of the present disclosure.

FIG. 5 illustrates an example of how the second terminal 212 of the test prod 210 is connected to an adaptor 510 according to an embodiment of the present disclosure. As shown, the adaptor 510 has a rectangular body 511, two legs 512 and 513 in a rectangular shape. As an example, FIG. 5 shows a specific shape of the adaptor 510 which has better heat dissipation performance with a larger body and can be easily and steadily mounted on a testing platform (which will be described later). However, it shall be appreciated that the adaptor 510 may have a different shape, e.g. the adaptor body 511 may be cylindrical, round etc. and the adaptor 510 may not have the legs 512 or 513 or have the legs in different shapes. The specific shape of the adaptor 510 doesn't form a limitation to the scope of the present disclosure.

In the specific example as shown in FIG. 5, the threaded second terminal 212 of the test probe 210 is mechanically and electrically connected to the leg 512 of the adaptor 510 via threads to provide a reliable connection. This threaded connecting method provides convenient maintenance, i.e. easier to change the test probe. On the other side, the cable 520 of the testing equipment (not shown) is inserted through the adaptor body 511 and fastened by a screw 530. The cable 520 is supported by the leg 513 of the adaptor and may optionally be soldered on the leg 513 to obtain a good electrical connection. This connecting method between the adaptor 510 and the cable 520 of the testing equipment offer a reliable joint when both the test probe 200 and the adaptor 510 moves together.

In an embodiment, the adaptor 510 may be made of C14500 tellurium copper, e.g. with plating 1 μm Au (aurum) and 0.2~0.3 μm Ni (nickel) and 0.7 g Co (cobalt), for high wear capability and good durability. The high percentage of copper may make the adaptor ideal for electrical conduction and thermal dissipation. The hardness of C14500 may provide good manufacturing performance.

In another embodiment of the test probe 200 as shown in FIG. 3, the first terminal 211 of the test prod 210 may have a conic end shape. The conic end shape may provide better accommodation of different sizes/shapes of test pins, i.e. input/output terminals, of the power module without customization of the test probe for different power modules. It is particularly useful for volume production and testing of various kinds of power modules. Also, the conic shape can provide a larger contact area, e.g. with a line/area contact instead of a point contact when using the traditional test probe, between the test probe and the input/output terminal of the power module. However, it shall be appreciated that other end shapes of the first terminal 211 of the test probe are also possible, for example a rectangular shape customized for a particular rectangular input/output terminal of a power module. A specific end shape will not form a limitation to the present disclosure.

In yet another embodiment of the test probe 200, the test prod 210 may have a second stopper 215 on the outside of the internally extending stopper of the tube 220. The second stopper 215 is provided herein to limit the movement range of the tube 220 on the test prod 210. Preferably, the second stopper 215 may be provided side by side with the internally extending stopper 221 of the tube 220. Optionally, the second stopper 215 may be formed as a protrusion from the test prod 210. The second stopper 215 may also be formed in a ring around the test prod 210, a half ring, or a cross claw around the test prod 210 etc. The particular shape of the second stopper 215 doesn't form a limitation to the present disclosure.

In yet another embodiment of the test probe 200, the tube 220 may also have an externally extending stopper 223. The externally extending stopper 223 is provided to limit the position of the test probe 200 relative to the testing platform (which will be described later).

Figure 6:
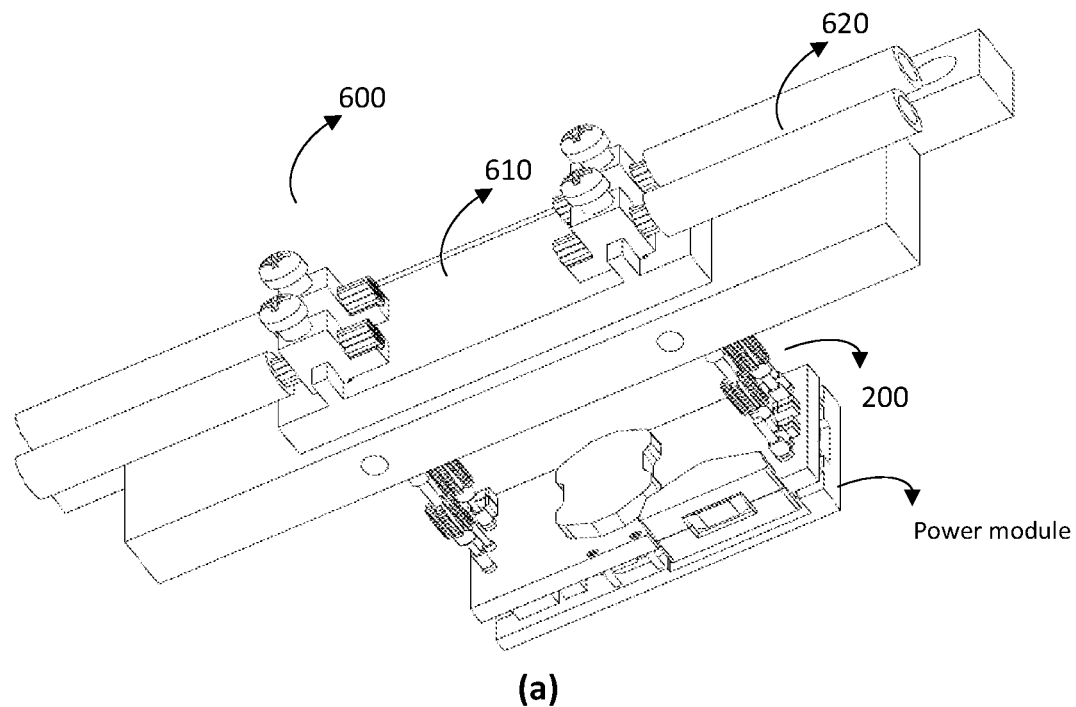
FIG. 6 illustrates a schematic structure of a power module testing system according to an embodiment of the present disclosure.
Figure 6:
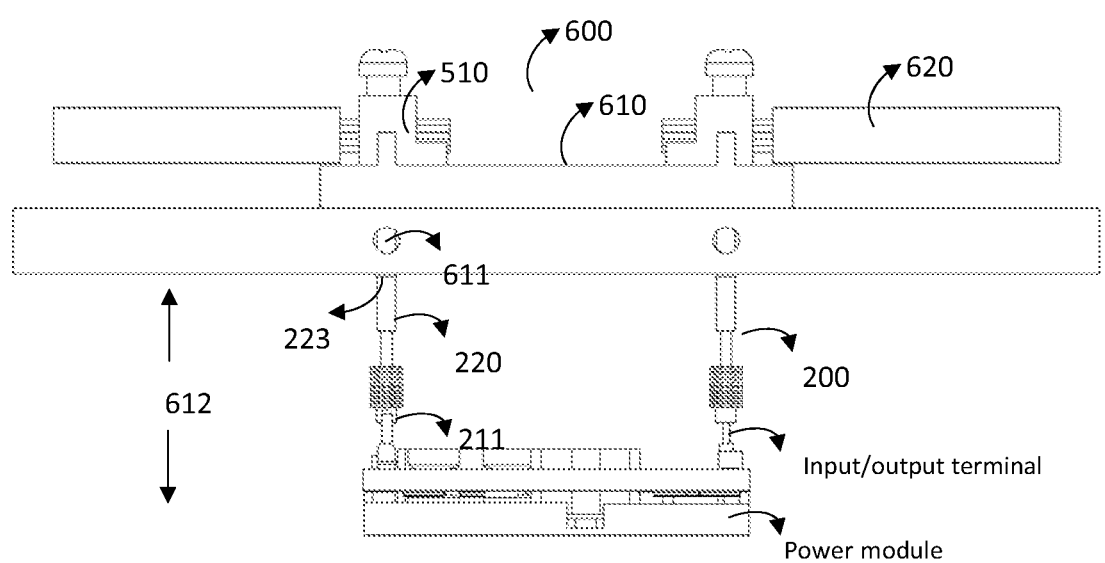

FIG. 6 illustrates a schematic structure of a power module testing system 600 using the test probe 200 according to an embodiment of the present disclosure. Particularly, FIG. 6(a) shows a perspective view of the structure of the power module testing system 600, while FIG. 6(b) shows a side view of the structure of the power module testing system 600.

The power module testing system 600 comprises at least one electrical test probe 200 as shown in FIG. 2 or FIG. 3 (four as shown in FIG. 6), a testing platform 610 and a testing equipment 620 (only a cable of the testing equipment is shown in FIG. 6).

For ease of understanding, the power module to be tested is also shown in FIG. 6, which may be a Direct Current-Direct Current (DC-DC) power module, for example. The power module testing system 600 may also be more generally applied to other types of power modules, e.g. Alternative-Current (AC)-DC power modules.

In the embodiment of FIG. 6, the test platform 610 is provided to hold the electrical test probe 200, so that the test platform can guide movement of the test probe 200 with regard to the power module to be tested. The test platform may also assist connection of the test probe 200 with the testing equipment 620.

Particularly, the tube 220 of the test probe 200 is fixed on the test platform 610, e.g. by a screw 611 into the test platform 610. As shown in FIG. 6(b), the extent that the tube can be inserted into the test platform 600 is limited by the second stopper 223 of the tube 220.

Then, the test platform 610 can guide movement of the test probe 200 towards or away from the power module to be tested, in the directions as shown by arrows 612. For example, when the test platform 610 goes down towards the power module to be tested, the test probe 200 fixed on the test platform 610 also goes down towards the power module to be tested.

Figure 7:
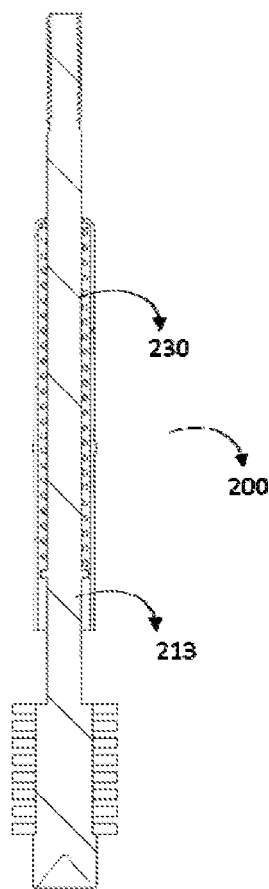
FIG. 7 shows the compressed state of the elastic element of a test probe.

When the first terminal 211 of the test probe 200 touches the input/output terminal on the power module to be tested and continues to move down towards the power module for a certain distance, a force upwards will be applied onto the test probe 200. Then the elastic element 230 of the test probe 200 will be compressed by the first stopper 213 of the test prod 200, so that the pressure towards the input/output terminal of the power module can be buffered by the compression of the elastic element 230, and thus a soft and close contact between the first terminal 211 of the test probe 200 and the input/output terminal of the power module can be achieved. FIG. 7 shows the compressed state of the elastic element 230 of the test probe 200.

In an embodiment of the power module testing system 600, the adaptor 510 as shown in FIG. 5 may be held over a first surface of the test platform 610. A cable of the testing equipment may be electrically connected to the adaptor. Then the second terminal 212 of the test prod 210 of the electrical test probe 200 may be passed through the test platform from a second surface of the test platform towards the first surface and electrically connected to the adaptor, the second surface being opposite to the first surface.

Figure 8:
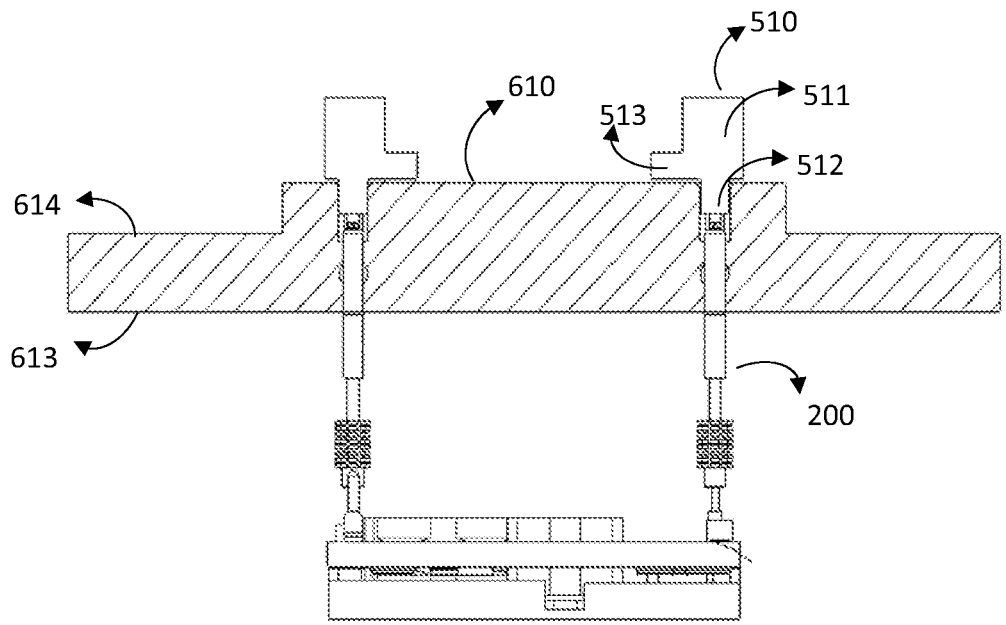
FIG. 8 illustrates an example connection between a test probe and an adaptor 510 on a test platform.

FIG. 8 illustrates an example connection between the test probe 200 and the adaptor 510 on the test platform 610.

As shown in FIG. 8, the threaded terminal of the test prod of the test probe 200 is inserted into the test platform 610 from the bottom surface 613 (corresponding to the second surface) of the test platform 610 towards the top surface 614 (corresponding to the first surface) of the test platform 610. The adaptor 510 has a leg 512, which is inserted from the top surface 614 into the test platform 610 and then connected via threads with the test prod of the test probe 200 inserted from the bottom surface 613. This connection method can provide stable positioning of the adaptor on the test platform and also provides a reliable connection between the adaptor 510 and the test probe 200.

In another embodiment, the adaptor 510 may not have the leg 512 but have a flat bottom instead. The test prod of the test probe 200 may be longer and can be inserted out of the top surface 614 of the test platform 610 and connected with the adaptor, e.g. by threading into the adaptor.

The adaptor 510 as shown in FIG. 8 has another leg 513, which may be used to support the cable of the testing equipment. The cable can also be soldered onto the other leg 513 to provide a better electrical connection.

In FIG. 8, the body 511 of the adaptor 510 is shown in a rectangular shape and has a sharp edge. However, it shall be understood that the body of the adaptor may be in a different shape, e.g. cylindrical shape, and has a round edge. Likewise, the legs 513 and 512 are not limited to specific shapes and sizes.

Figure 9:
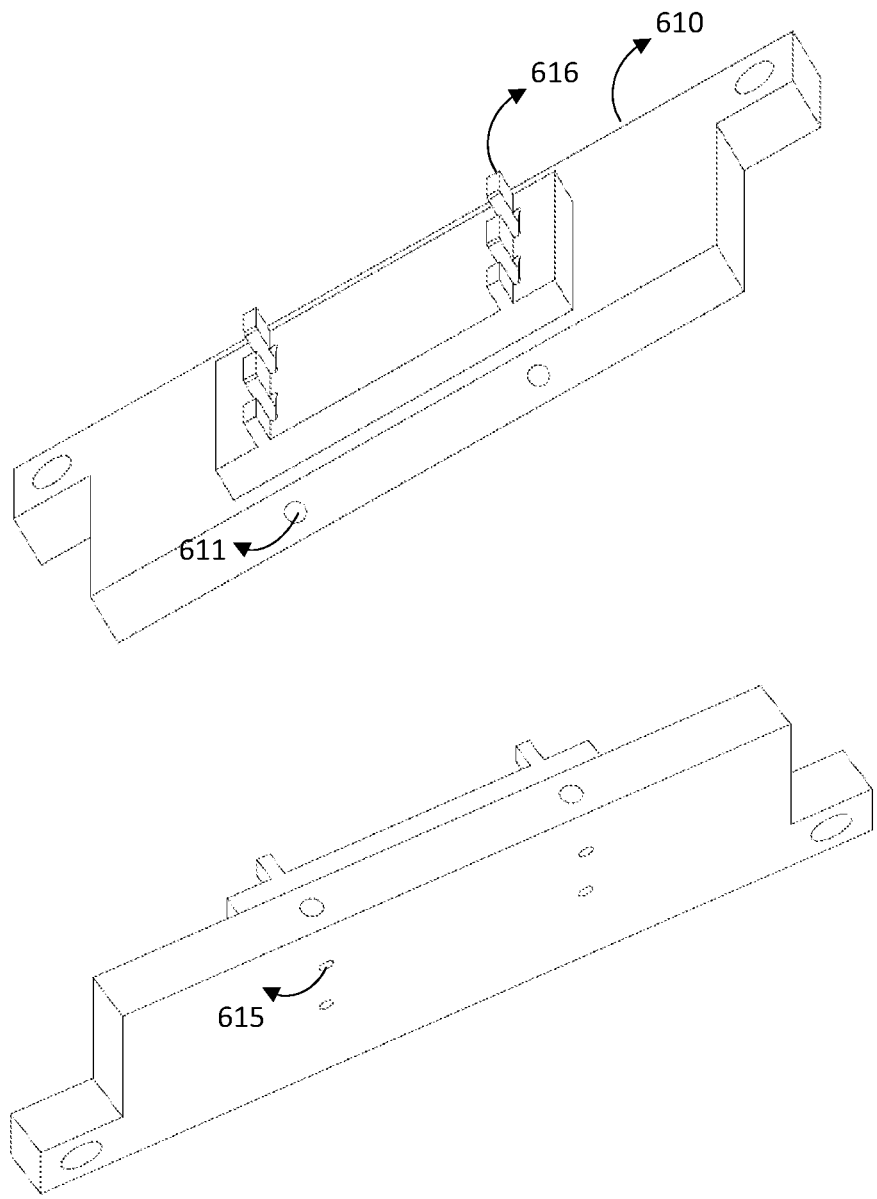
FIG. 9 illustrates an example structure of a test platform according to an embodiment of the present disclosure.

FIG. 9 illustrates an example structure of a test platform 610 according to an embodiment of the present disclosure. The test platform 610 may be made of an insulating material, e.g. glass fiber.

Holes 611 as shown are used to hold a screw for fixing a test probe. The holes 615 as shown on the bottom surface of the test platform 610 are used to accommodate the test probe inserted into the test platform. Standoffs 616 as shown on the top surface of the test platform 610 are used to hold an adaptor 510 so as to prevent its sliding or rotating. The numbers of the holes 611, 615 and standoffs 616 are not limited as shown in FIG. 9.

Other shapes or forms of the test platform may also be possible, as long as it can provide stable holding or fixing of the test probes. Preferably, the test platform may also assist connection of the test probe with the testing equipment.

It will be obvious to a person skilled in the art that, as the technology advances, the inventive concept can be implemented in various ways. The above described embodiments are given for describing rather than limiting the disclosure, and it is to be understood that modifications and variations may be resorted to without departing from the spirit and scope of the disclosure as those skilled in the art readily understand. Such modifications and variations are considered to be within the scope of the disclosure and the appended claims. The protection scope of the disclosure is defined by the accompanying claims.

The invention claimed is:

1. An electrical test probe, comprising:
a test prod, with a first terminal provided to form a contact with a power module to be tested and a second terminal provided to be connected with a testing equipment, the test prod having a first stopper between the first terminal and the second terminal, wherein the test prod has a fan-structured heat sink on a side of the first terminal;
a tube having an internally extending stopper, wherein the tube is mounted around the test prod in a longitudinal direction of the test prod; and
an elastic element accommodated between the first stopper of the test prod and the internally extending stopper of the tube, wherein the tube and the test prod are configured to have a relative movement within an elastic range of the elastic element, and wherein an area of a cross section of the test prod is larger than an area of a corresponding cross section of the elastic element.

2. The electrical test probe according to claim 1, wherein a first end of the elastic element is fixed to the first stopper of the test prod and a second end of the elastic element is fixed to the internally extending stopper of the tube.

3. The electrical test probe according to claim 1, wherein the internally extending stopper is formed as an internally bending end, and wherein the first stopper is formed as a protrusion from the test prod.

4. The electrical test probe according to claim 1, wherein the heat sink is placed towards an end of the first terminal.

5. The electrical test probe according to claim 1, wherein the second terminal of the test prod is electrically connected to the testing equipment via an adaptor.

6. The electrical test probe according to claim 1, wherein the first terminal of the test prod has a conic shape.

7. The electrical test probe according to claim 1, wherein the test prod has a second stopper on the side of the internally extending stopper of the tube.

8. The electrical test probe according to claim 1, wherein the tube further has an externally extending stopper.

9. The electrical test probe according to claim 1, wherein the second terminal of the test prod is connected to an adaptor in a thread connection.

10. The electrical test probe according to claim 1, wherein the elastic element is a spring.

11. The electrical test probe according to claim 1, wherein the electrical test probe is made of C14500 tellurium copper.

12. A power module testing system, comprising:
at least one electrical test probe according to claim 1;
a test platform configured to hold the electrical test probe; and
the testing equipment configured to test the power module via the electrical test probe.

13. The power module testing system according to claim 12, wherein an adaptor is held over a first surface of the test platform, and wherein:
a cable of the testing equipment is electrically connected to the adaptor; and
the second terminal of the test prod of the electrical test probe is configured to pass from a second surface of the test platform towards the first surface and electrically connected to the adaptor, the second surface being opposite to the first surface.

14. The power module testing system according to claim 13, wherein the adaptor is made of C14500 tellurium copper.

15. The power module testing system according to claim 13, wherein the cable of the testing equipment is screwed and soldered on the adaptor, and wherein the test prod of the electrical test probe is threaded into the adaptor.

16. The power module testing system according to claim 12, wherein the tube of the test probe is fixed on the test platform, and wherein the test platform is configured to guide movement of the test probe towards or away from the power module to be tested.

17. The power module testing system according to claim 12, wherein the test platform is made of an insulating material.

* * * * *